Nov. 8, 1960 J. S. MURRAY 2,959,741
SELF-BIASED TRANSISTOR AMPLIFIERS
Filed Oct. 23, 1957 3 Sheets-Sheet 1

Inventor
John Somerset Murray
by Malcolm W. Fraser
attorney

Inventor
John Somerset Murray
by Malcolm W. Fraser
attorney

Nov. 8, 1960 J. S. MURRAY 2,959,741

SELF-BIASED TRANSISTOR AMPLIFIERS

Filed Oct. 23, 1957 3 Sheets-Sheet 3

Inventor
John Somerset Murray
by Malcolm W. Fraser
attorney

United States Patent Office 2,959,741
Patented Nov. 8, 1960

2,959,741

SELF-BIASED TRANSISTOR AMPLIFIERS

John Somerset Murray, 144A Sloane St., London SW. 1, England

Filed Oct. 23, 1957, Ser. No. 691,839

Claims priority, application Great Britain Oct. 23, 1956

2 Claims. (Cl. 330—19)

Figure 1:
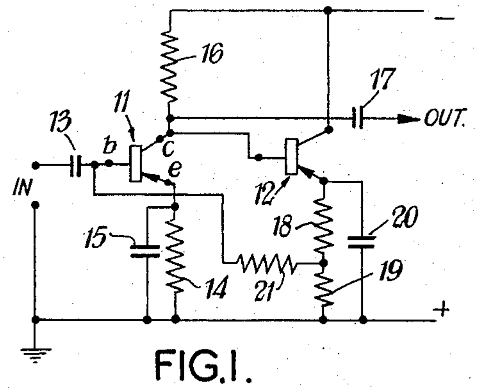

This invention relates to improvements in and relating to transistor amplifiers, and in particular to the reduction to a minimum of noise generated in the transistors of such amplifiers.

Some noise is inevitably generated in a transistor due to its semi-conductive nature, and the noise level is known to be an increasing function of the instantaneous voltage between the collector and base electrodes of the transistor. In a multi-stage amplifier, due to amplification of the signal by successive stages, the contribution of noise from the successive transistors decreases from one transistor to the next, which means that a reduction of the noise generated by the transistor of the first stage is much more effective than an equal reduction in a succeeding stage.

It is known that minimisation of the noise generated by a transistor can be achived by operating the transistor with a very low voltage between its collector and its base, but the maintenance of a substantially steady suitable low voltage, in conditions of varying temperature and using associated resistors of commercially normal tolerance in value, is difficult.

It is an object of the present invention to provide a single stage or multi-stage transistor amplifier in which the voltage between the collector and the base of the transistor in the first stage is automatically maintained at a suitable low value, thereby achieving the benefit of low noise generation under normally variable conditions of manufacture and use.

A one- or two-stage transistor amplifier is normally unconditionally stable, but a three-stage amplifier with or without negative feedback, such as will be described below, has intrinsically a much higher overall gain, and it may occur that the time constant of the input circuit is reflected through the transistor of the input stage in such manner as to introduce a further time constant which allows the amplifier to oscillate spontaneously at low frequency, or, if low frequency oscillation does not actually occur, causes the frequency response characteristic of the amplifier to show a noticeable peak at its low frequency end.

It is a further object of the invention to provide an amplifier of low input impedance, in which, in addition to maintenance of a steady low bias for the first transistor, it is ensured that low-frequency distortion and instability are eliminated or at least substantially reduced.

Yet a further object of the invention is the provision of an amplifier of the kind referred to, in which the input stage may be simply altered, by switching, to present to a signal source either a low-impedance or a high-impedance input circuit as may be required, without significantly altering either the noise level (insofar as it is dependent on the biassing of the first transistor) or the shape of the frequency characteristic.

These and other objects of the invention will be made clear in the following description of preferred embodiments of an amplifier according to the invention.

Figure 5:
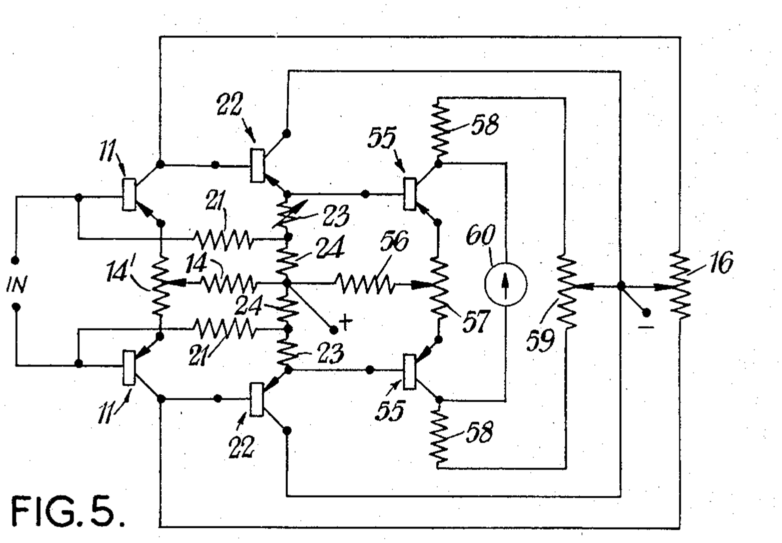
Figure 2:
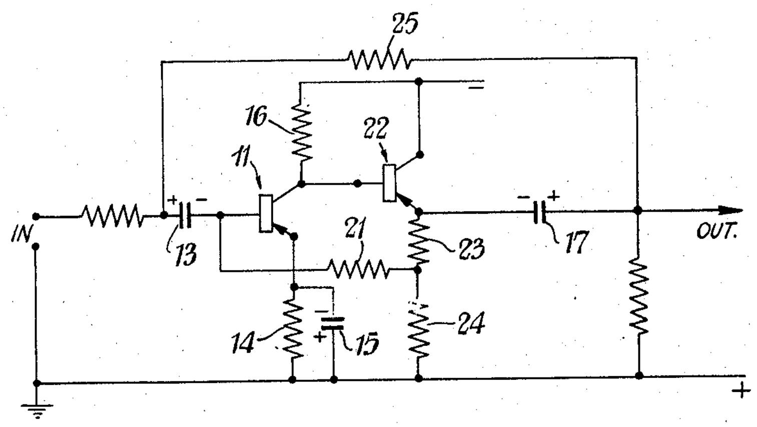
Figure 3:
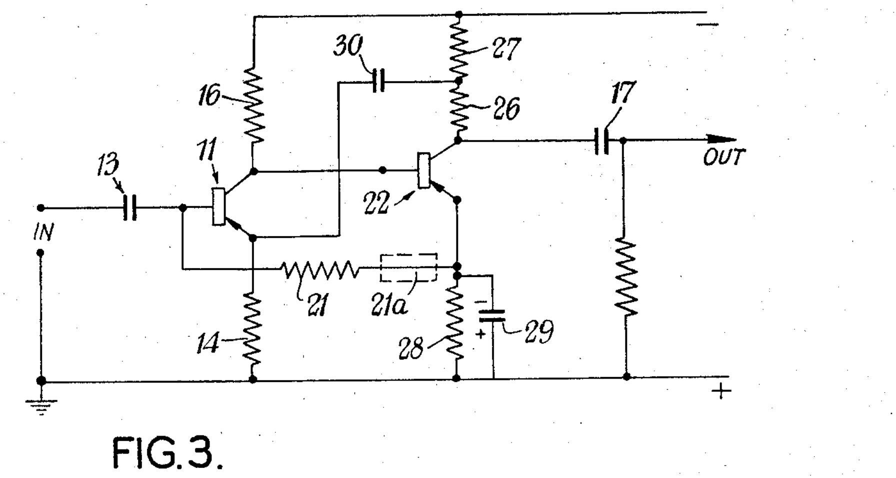
Figure 4:
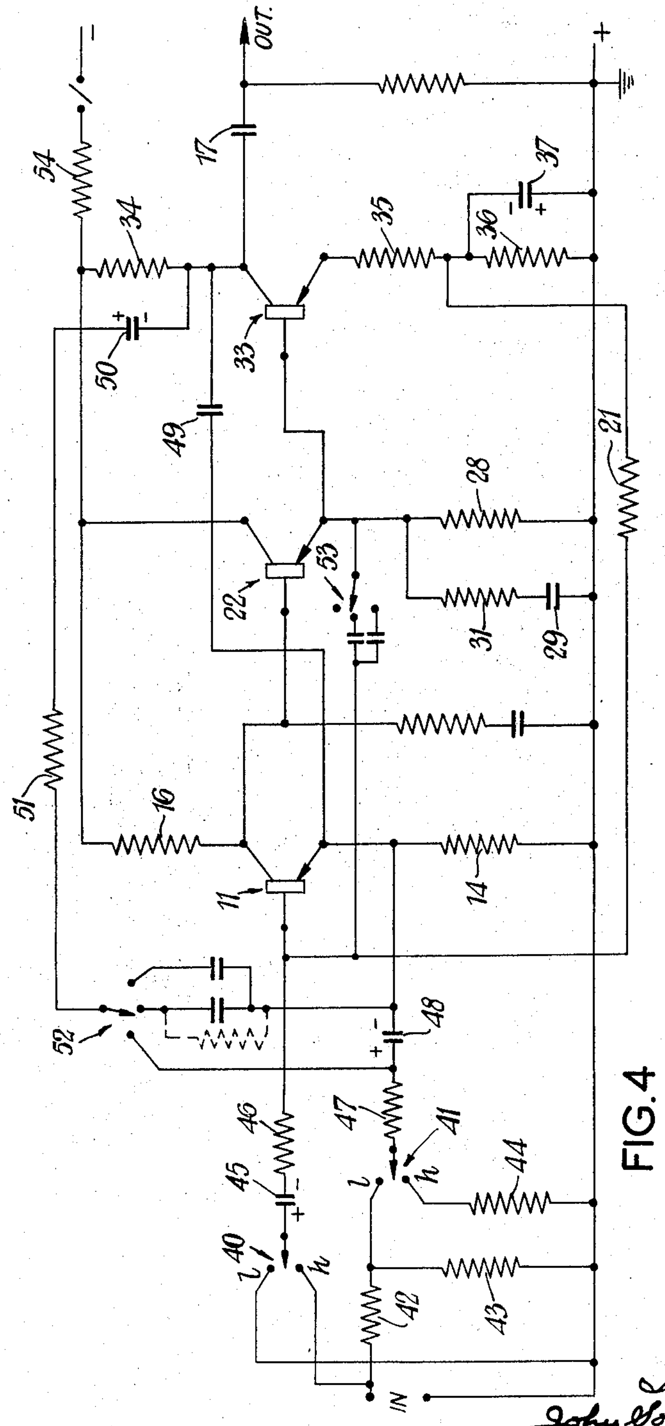

The invention will be explained in greater detail with reference to the accompanying drawings, in which:

Figure 1 is a schematic diagram of a single-stage transistor amplifier according to the invention, in which the base-collector bias for a first transistor included in the amplifying stage is provided from the circuit of a second transistor included specifically for that purpose, Figure 2 shows a two-stage transistor amplifier with the transistors of the two stages connected in a common-emitter-common-collector configuration, in which the bias for the first-stage transistor is derived from the circuit of the second-stage transistor, Figure 3 shows a two-stage transistor amplifier which differs from that of Figure 2 in that the transistors of the two stages are connected in a cascaded common-emitter configuration, Figure 4 shows a three-stage transistor amplifier in which the bias for the first-stage transistor is derived from the circuits of the second- and third-stage transistors, and Figure 5 shows an amplifier which is adapted for the amplification of direct-current signals and includes two amplifiers generally similar to that shown in Figure 2, arranged in push-pull.

The basic feature of the invention may be understood from a description of the single-stage amplifier shown in Figure 1, which comprises an amplifying transistor 11 and a transistor 12 whose sole function is to provide for the transistor 11 a base-collector bias voltage which will be within a suitable range of low values regardless of variation of the magnitude of associated resistances due to aging or the use of components which differ within commercially accepted tolerances of their designed values.

Both transistors have base-, emitter- and collector-electrodes which are shown conventionally and, in the case of the transistor 11, are further indicated *b, e* and *c* respectively. The base of the transistor 11 is connected through an input condenser 13 to one of a pair of input terminals, of which the other is connected to the reference potential line of the amplifier, to which is also connected the positive terminal of an operating (suitably 4.5 volts) voltage source. The emitter of the transistor 11 is connected to earth through a resistor 14 with a by-pass condenser 15 in parallel, and the collector of the transistor 11 is connected through a load resistor 16 to the negative voltage line. The amplified output signal is taken from the collector through an output condenser 17. As described so far the circuit arrangement is conventional for a single-stage transistor amplifier.

The novel feature of the amplifier is the means for maintaining a suitable low bias voltage between the base and the collector of the transistor 11. The collector and base of the transistor 12 are connected, respectively, to the negative voltage line and to the collector of the transistor 11, while the emitter of the transistor 12 is earthed through biassing resistors 18 and 19 in series, by-passed by a condenser 20 in parallel. The junction of the resistors 18 and 19 is connected back to the base of the transistor 11 through a resistor 21. The base-collector voltage of the transistor 11 is therefore derived as the sum of the base-emitter potential drop of the transistor 12, the potential drop across the resistor 18 and the potential drop across the resistor 21, which are normally in the same sense. The values of the resistances 18, 19 and 21 are adjusted to suit the circumstances, in particular the required signal level at the collector of the transistor 11. For very low signal level, the value of the resistor 18 may even be zero.

Now, the base-emitter voltage of the transistor 12 is substantially constant and the potential drop across the resistor 18 may be selected from zero upwards, according to the magnitude of the resistors 18 and 19. The potential drop across the resistor 21 depends on the residual no-signal current in the base of the transistor 11, and this (being the algebraic sum of the base-emitter current and, in the opposite direction, the normally smaller base-collector leakage current which, however, increases with increasing temperature) decreases as the temperature increases, and may eventually change sign, and in the type of low-level amplifier under consideration and using present-day transistors may vary between zero and a few tens of micro-amps in either direction. Therefore if the value of the resistor 18 is chosen to give a suitable bias voltage when the amplifier is cold, the base-collector bias will decrease as the temperature rises, and this decrease, if sufficiently large, might result in clipping of the signal. That is, as the temperature rises, the residual no-signal base current of the transistor falls initially and may even change sign; and the potential drop across the resistor 21 decreases, or may even change sign correspondingly, but since the residual current is in any case very small the total bias voltage, which includes the substantially constant base-emitter voltage of the transistor 12, and potential drop across the resistor 18, changes little. Thus, though the residual current has decreased or changed direction, the base-collector bias of the transistor 11, which to a large extent determines the noise level, remains within a suitable range of low values.

The corresponding bias voltage is obtained in conventional amplifiers by means of four resistors, one pair being a potential divider connected to the base and the other two being in the emitter and collector circuits respectively. This has the disadvantage which is overcome by the present invention that changes in the working point due to changes in the residual current may only be kept small at the expense of an increase in wasted battery power, and they provide no compensation for ageing or out of tolerance components.

It will be noted that the magnitude of the base-collector bias for the transistor 11 is independent of the values of the components of the amplifier outside the circuit from the collector to the base, via the base and emitter of the transistor 12 and the resistors 18 and 21, except insofar as those other components determine the emitter current of the transistor 12. This emitter current, however, is substantially constant within the normal operating conditions of the transistor, and given that the components are within normal commercial tolerances of the designed values they can be disregarded so far as the bias is concerned. Also, the values of the resistors 18 and 21 may differ within ordinary commercial tolerances of their designed values, since the corresponding potential variations will be only a fraction of their nominal values, which in turn are only parts of the total bias which includes the substantially constant potential between the base and the emitter of the transistor 12.

Figure 2 shows a two-stage amplifier in which the base-collector bias voltage for a transistor 11, connected in a manner essentially similar to the connection of the transistor 11 in Figure 1, is derived from the circuit of a transistor 22 in the second stage. The output signal from the collector of the transistor 11 is fed to the base of the transistor 22, of which the collector is connected to the negative voltage line. The load impedance of the transistor 22 is composed of two resistors 23 and 24 in series between the emitter of the transistor and earth, and the output signal is taken off through an output condenser, referenced 17 as in Figure 1. This arrangement provides a low impedance output.

The base collector bias circuit for the transistor 11 is completed by a resistor, referenced 21 as in Figure 1, connected between the base of the transistor 11 and the junction of the resistors 23 and 24, the value of the resistor 23 being chosen to give the desired bias.

The amplifier shown in Figure 2 further differs from that shown in Figure 1 in that there is provided a negative feedback path, taken through a resistor 25 from the signal output line to the input side of an input condenser 13, corresponding to the similarly referenced input condenser in Figure 1, of the transistor 11. In this case the bias resistor 21 also acts as an A.C. feedback path, since part of the output signal voltage is developed across the resistor 24, and in conjunction with the path containing the resistor 25 provides a high-pass filter characteristic for the amplifier which in a given experimental case accepted frequencies above 17 cycles/second and provided a substantially flat gain characteristic for the amplifier up to at least 20 kc./s. Such an amplifier may conveniently be used to replace a conventional input coupling transformer.

Figure 3, like Figure 2, shows a two-stage amplifier, but in this case the transistors are arranged in a cascaded common-emitter configuration. In Figure 3, the base, collector and emitter of the first-stage transistor 11 are respectively connected to an input terminal through an input condenser 13 and the negative and positive voltage lines (which latter is connected to a second input terminal) through resistors 16 and 14. The base of the second-stage transistor 22, is connected to the collector of the transistor 11, while its collector and emitter are connected respectively to the negative and positive voltage lines through a load comprising two resistors 26 and 27 in series and a resistor 28 and by-pass condenser 29 in parallel. The output signal is taken from the collector of the transistor 22 through an output condenser 17.

The base-collector bias circuit for the transistor 11 is completed, as in Figure 2, by a resistor 21 connected from the base of the transistor 11 to the emitter circuit of the transistor 22, in this case directly to the emitter. A negative feed-back loop is provided by a condenser connected between the emitter of the transistor 11 and the junction of the two resistors 26 and 27 which constitute the load impedance of the transistor 22.

It will be seen that in both Figure 2 and Figure 3, the signal input to the first stage is shunted by the resistors 21 and 24 (or 21 alone), and where these are of low value or the signal source is of comparable impedance, it may be desirable to decrease the shunting effect. This may be done, as is indicated schematically in Figure 3, by connecting in series with the resistor 21 a low-pass filter **21*a*, which, while leaving unaffected the base-collector bias for the transistor 11**, presents a high impedance to signals to be amplified.

The three-stage amplifier shown in Figure 4 comprises three transistors 11, 22 and 33. The emitter and collector of the first-stage transistor 11 are connected respectively to the earthy, positive voltage line by an emitter resistor 14 and to the negative voltage line by a load resistor 16, and the amplified signal from the first stage is taken from the collector of the transistor 11 to the base of the second stage transistor 22, the base being connected to earth through a resistance and condenser in series, which introduce between the transistors 11 and 22 a signal phase shift which improves the stability of the amplifier. The collector of the transistor 22 is connected directly or through a voltage dropper resistance to the negative voltage line, and the load impedance for the transistor 22 comprises a resistor 28 connected between the emitter and the positive voltage line, shunted by a resistor 31 and a condenser 29 in series. This connection of the transistor 22 is analogous to a cathode-follower arrangement in a valve amplifier, and the second-stage output signal is taken from the emitter of the transistor 22 to the base of the transistor 33. The collector of the transistor 33 is connected to the negative voltage line through a load resistor 34 and the amplifier output signal is taken from the collector of the transistor 33 through an output condenser 17. The emitter of the transistor 33 is connected to the positive voltage line through a bias resistor 35 for the transistor 11 (as will be explained) in series with a resistor 36 shunted by a bypass condenser 37. The base-collector bias circuit for the transistor 11 is completed by a bias resistor 21 connected between the lower end of the resistor 35 and the base of the transistor 11. In this case, therefore, the bias applied between the base and the collector of the transistor 11 is equal to the sum of the base-emitter potential differences of the two transistors 22 and 33, and the potential drops across the two bias resistors 21 and 35.

The input circuit to the transistor 11 in the amplifier shown in Figure 4 is more complicated than the simple input circuits shown in Figures 1 to 3, since it includes switches by means of which the input signal to be amplified may be applied either to the base or the emitter of the transistor 11, according as the signal source is of high or low impedance, respectively. The switches are arranged so that when the signal is applied to the base, the emitter is connected to the earthy, positive voltage line to which the earthy side of the signal source is also connected through a low impedance and vice versa.

The input circuit illustrated comprises two ganged two-way switches 40 and 41, of which the two positions are marked *h* and *l*, corresponding to high- and low-impedance signal sources respectively. The "live" input terminal is connected directly to the *h* position of the switch 40 and to earth through two resistors 42 and 43 in series, the junction of these two resistors being connected to the *l* position of the switch 41. The *l* position of the switch 40 is earthed directly, as is the earthy input terminal, and the *h* position of the switch 41 is earthed through a low-value resistor 44. The moveable terminal of the switch 40 is connected to the base of the transistor 11 through an input condenser 45 and a resistor 46 in series, and the moveable terminal of the switch 41 is similarly connected, through a resistor 47 and input condenser 48, to the base of the transistor 11. Thus with the switches 40 and 41 in the *l* position, the input signal is applied to the emitter of the transistor 11, whose base is then earthed, and in the *h* position, the signal is applied to the base of the transistor, the emitter being earthed.

The amplifier is provided with negative feed-back through a condenser 49 from the collector of the transistor 33 back to the emitter of the transistor 11 which provides high-frequency stability, and a parallel loop between the same points, which includes a condenser 50 and resistor 51 in series and, also in series, one of a number of different condensers, selectable by means of a switch 52, to give bass correction for the source of input signals—tape-recorder head, short- or long-playing records, etc., as the case may be. The effect of one or more of the selectable condensers may be further modified, in known manner, by shunting them with resistors as is shown in one case, by broken lines.

A high-frequency de-emphasis circuit presents some difficulty, in that a direct capacitive shunt across the feedback resistor 51, which would produce the required frequency characteristic, would also have the undesirable effect of reducing the available output level. However, the de-emphasis circuit illustrated in Figure 4, comprising one of two condensers selectable for connection between the emitter of the transistor 22 and the base of the transistor 11 by a switch 53, which has a third unconnected terminal so that no de-emphasis may be provided if desirable, yields a satisfactory compromise. When one of these condensers is switched in, it provides an additional feedback loop, consequently reducing the overall gain of the amplifier, at high frequencies. At sufficiently high frequencies it will reduce the gain of the first two stages to substantially unity, while the gain of the output stage is unaffected. Thus the overall gain of the amplifier decreases to a constant at high frequencies instead of the theoretically desirable continuous fall of 6 dbs/octave. The difference between the actual performance and the ideal is, however, sufficiently small for it to be ignored. If necessary, it can always be dealt with by a passive circuit arranged after the output stage or at the input stage. It may more conveniently be adjusted by the use of the normal bass and treble controls usually supplied in a later stage of a complete amplifying system.

As has been mentioned briefly in the introductory paragraphs, while one-stage and two-stage amplifiers, such as are shown in Figures 1 to 3, are normally unconditionally stable, a three-stage amplifier, such as that shown in Figure 4, has intrinsically a much higher gain, and care must be taken to avoid low-frequency distortion or spontaneous oscillation.

With the switches 40 and 41 in the *l* position, and a low impedance signal source connected across the input terminals, the emitter of the transistor 11 is earthed through the input condenser 48 and a low series resistance. The reactance of the condenser 48 is reflected through the transistor 11 and introduces a third time constant, in addition to those provided by the condenser 45 (now connected to earth through the switch 40, as a decoupling condenser) and the decoupling condenser 37 which is introduced via the bias resistor 21.

It has been found that the base of the transistor 11, to which bias is applied through the resistor 21, should not be decoupled directly to earth through the condenser 45, and it is for this reason that the resistor 46 has been introduced in series with the condenser 45, effectively between the base end of the resistor 21 and earth. The resultant phase-shift, of feedback through the bias resistor 21, as compared with the case if the bias resistor 21 were connected directly between the base of the transistor 11 and the condenser 45, assures stability of the amplifier at low frequencies.

A resistor 54 may be included, as shown, in the negative voltage line of the amplifier, further to improve low-frequency stability.

With the switches 40 and 41 in the *h* position, the emitter of the transistor 11 is earthed through a low resistance 44, replacing the low-impedance signal source, and a high impedance source is connected to the base of the transistor 11 through the condenser 45, now serving as an input condenser. It should be remarked that this switching of the input circuit does not substantially affect either the noise level or the frequency- and feedback characteristics, provided that the value of the resistances 44 and 47 in series is chosen, relative to the value of the resistor 51, so that the overall feedback is maintained at such value that the bass response, relative to, say, 1000 c./s., is substantially independent of the position of the switches.

Thus by proper consideration of the factors determining the low-frequency stability, there has been provided an amplifier with extremely good frequency characteristics adapted to amplify signal from a high- or a low-impedance source. It may be mentioned that with an amplifier such as that shown in Figure 4 switched in its *l* position, there has been measured an input impedance, in front of the input condenser 48, as low as two ohms (partly due to the highly effective negative feedback), the frequency characteristic of the amplifier being flat within 1 db over the range 10 to 20,000 c./s. Such an amplifier is a high efficient, low-impedance, low-noise factor amplifier.

The amplifier is of comparable efficiency in its *h* position as a high-impedance input amplifier, and by the inclusion, in series with its bias resistor 21, of a low-pass filter as indicated in Figure 3, may be successfully used with a signal source of high reactive impedance, such as a tape recorder head.

Finally, Figure 5 shows a D.C. amplifier which includes as its first and second stages two two-stage amplifiers, each similar to that shown in Figure 2, which are arranged in push-pull. Components of the first two stages are therefore indicated by the same reference numerals as are used for corresponding components in the amplifier shown in Figure 2, and the circuits differing in that in Figure 5 the de-coupling condenser 15 and the external feedback loop through the resistor 25 are omitted.

The D.C. signal input is applied between the bases of the two first-stage transistors 11. The first-stage emitter resistor 14 is made common to the emitter circuits of both transistors 11, and is complemented by a small adjustable potentiometer 14′ connected between the two emitters for balancing purposes. The load resistor 16 of Figure 2 is replaced by the two sides of a potentiometer 16′ which similarly allows for balancing. The resistor 23 connected to the emitter of one of the transistors 22 is also made variable, which allows the base-collector bias voltages for the two transistors 11 to be made equal.

The output signals taken from the emitters of the two transistors 22 are applied to the respective bases of a further pair of transistors 55 for which no close biasing arrangement is required, and which have a common resistor 56 connected in their emitter circuits, together with a relatively small potentiometer 57 for balancing purposes. Similarly the collectors of these two transistors are connected to the negative voltage line through load resistors 58 and a relatively small balancing potentiometer 59.

Output signals from the third stage of the amplifier, which comprises the transistors 55, are taken from the collectors of those transistors and are shown applied to a measuring instrument 60, it being assumed here that the amplifier is for use in the measurement of small D.C. voltages. The output signal could alternatively be applied to operate a relay or to other functions, in dependence on a small voltage which, without amplification, would be sufficient for the purpose.

The amplifier is balanced for use as follows: the bases of the transistors 55 are connected together temporarily to ensure that they are at the same potential, and the potentiometer 57 is adjusted to give zero reading on the meter 60. The bases of the transistors 11 are then temporarily connected together and the potentiometer 14′, which must have a very fine control, is adjusted in similar manner. It will be clear that when this has been done the base potentials of the transistors 55 have been brought to equality. It remains to equalise the potentials of the bases of the transistors 11 with the input in the open-circuit condition, and this is achieved by adjusting the variable resistor 23 in one of the push-pull branches, to alter the base-collector bias in the corresponding transistor 11. The potentiometers 16 and 59 are provided to compensate for battery voltage variations in known manner by equalisation of the pairs of collector loads.

It will be noted that in all the described embodiments of the invention, p-n-p transistors are shown in the circuits. It will, however, be evident that n-p-n transistors may be used instead, in which case the supply voltage source will be reversed in direction, "positive" replacing "negative" throughout. The bias circuits for the first transistors remain unchanged in each case.

What I claim is:

1. A transistor amplifier comprising a pair of terminals for a supply voltage source, a first transistor, a second transistor and a third transistor each having a base, a collector and an emitter, the bases of the second and third transistors being connected direct-curent conductively to the collector of the first transistor and the emitter of the second transistor respectively, a first-stage collector load resistor and a first-stage emitter resistor respectively connecting the collector and the emitter of the first transistor to the respective terminals, a direct connection and a second-stage emitter resistor respectively connecting the collector and the emitter of the second transistor to the respective terminals, a third-stage collector load resistor and third-stage emitter resistance respectively connecting the collector and the emitter of the third transistor to the respective terminals and a direct-current conductive connection connecting the emitter of the third transistor to the base of the first transistor thereby to establish an operating base-collector bias for the first transistor, wherein there is connected to the base of the first transistor a first-phase-displacing connection constituted by resistance and capacitance in series and there is connected to the emitter of the first transistor a second phase-displacing connection constituted by resistance and capacitance in series, there being provided a pair of signal input terminals to which the said phase-displacing connections are respectively connected and of which one is connected to the supply voltage terminal to which the emitter of the first transistor is connected by the first-stage emitter resistance.

2. An amplifier as claimed in claim 1, wherein there is provided switching means which connects the said first phase-displacing connection alternatively to one and to the other of the said signal input terminals and simultaneously connects the said second phase-displacing connection alternatively to the said other and to the said one of said terminals.

References Cited in the file of this patent

UNITED STATES PATENTS

| | | |
|---|---|---|
| 2,762,875 | Fischer | Sept. 11, 1956 |
| 2,789,164 | Stanley | Apr. 16, 1957 |
| 2,847,519 | Aronson | Aug. 12, 1958 |
| 2,860,195 | Stanley | Nov. 11, 1958 |
| 2,887,542 | Blair | May 19, 1959 |

OTHER REFERENCES

Shea: "Principles of Transistor Circuits," Published by John Wiley & Sons, 1953. Page 82 relied on.

Lowry: "All Transistor Hi-Fi Amplifier," Radio and Television News, November 1956, pages 44–46.

Murray: "Transistor Bias Stabilization," Electronic and Radio Engineer, May 1957, pages 161–165.

Owens: "Hi-Fi Preamp for Easy Listening," Radio-Electronics, September 1956, pages 59 and 60.